(12) United States Patent
Teng et al.

(10) Patent No.: US 8,642,166 B2
(45) Date of Patent: Feb. 4, 2014

(54) TRANSPARENT CONDUCTIVE THIN FILM

(71) Applicant: MKE Technology Co. Ltd, Taipei (TW)

(72) Inventors: Chien-Tung Teng, Taipei (TW); Wei-Lun Hsu, Taipei (TW)

(73) Assignee: MKE Technology Co., Ltd., Taipei (TW)

(*) Notice: Subject to any disclaimer, the term of this patent is extended or adjusted under 35 U.S.C. 154(b) by 0 days.

(21) Appl. No.: 13/729,846

(22) Filed: Dec. 28, 2012

(65) Prior Publication Data
US 2013/0171469 A1  Jul. 4, 2013

(30) Foreign Application Priority Data
Jan. 4, 2012  (TW) .................. 101100359 A

(51) Int. Cl.
*C03C 17/36*  (2006.01)

(52) U.S. Cl.
CPC ......... *C03C 17/3605* (2013.01); *C03C 17/3615* (2013.01); *C03C 17/3644* (2013.01); *C03C 17/3647* (2013.01); *C03C 17/3678* (2013.01)

USPC ........... 428/220; 428/426; 428/434; 428/457; 428/469; 428/629; 428/632; 428/646; 428/689; 428/697; 428/699; 428/701; 428/702

(58) Field of Classification Search
None
See application file for complete search history.

(56) References Cited

U.S. PATENT DOCUMENTS

| | | | |
|---|---|---|---|
| 4,565,719 A * | 1/1986 | Phillips et al. ............... | 428/34 |
| 5,591,529 A * | 1/1997 | Braatz et al. ................. | 428/457 |
| 2003/0228476 A1 * | 12/2003 | Buhay et al. .................. | 428/469 |
| 2005/0008852 A1 * | 1/2005 | Hartig ......................... | 428/336 |

FOREIGN PATENT DOCUMENTS

EP  599071 A1 *  6/1994  ............. C03C 17/36

* cited by examiner

*Primary Examiner* — David Sample
(74) *Attorney, Agent, or Firm* — Muncy, Geissler, Olds & Lowe, PLLC

(57) ABSTRACT

A transparent conductive thin film comprises at least one stack layer of Ag—$Ag_3Sn$—SnOx, or at least one stack layer of Ag—$Ag_4Sn$—SnOx.

10 Claims, 5 Drawing Sheets

TRANSPARENT CONDUCTIVE THIN FILM

CROSS REFERENCE TO RELATED APPLICATIONS

This Non-provisional application claims priority under 35 U.S.C. §119(a) on Patent Application No(s). 101100359 filed in Taiwan, Republic of China on Jan. 4, 2012, the entire contents of which are hereby incorporated by reference.

BACKGROUND OF THE INVENTION

1. Field of Invention

The invention relates to a transparent conductive thin film.

2. Related Art

The semiconductor photoelectric apparatus, such as a display apparatus, a touch apparatus, a light-emitting apparatus, or a solar cell, is configured with a conductive substrate for helping the electron's transmission. The conductive substrate includes a substrate and a transparent thin film disposed on the substrate. The transparent conductive thin film is also called the transparent conductive oxide (TCO), which is because the present transparent conductive thin film is mainly made by metal oxides, such as ITO, $In_2O_3$, $SnO_2$, ZnO, CdO, AZO, or IZO.

The conventional transparent conductive thin film is light permeable, but however, has a high resistance attaining to 10~100 Ω/sq. This high resistance slows down the signal transmission and the response speed, and also the efficiency of the product. Hence, the material with lower resistance urgently needs to be developed for producing the transparent conductive thin film.

SUMMARY OF THE INVENTION

In view of the foregoing, an objective of the invention is to provide a transparent conductive thin film with a lower resistance.

To achieve the above objective, a transparent conductive thin film comprises at least one stack layer of Ag—$Ag_3$Sn—SnOx, or at least one stack layer of Ag—$Ag_4$Sn—SnOx.

In one embodiment, the Ag layer has a thickness between 2 nm and 15 nm.

In one embodiment, the $Ag_3$Sn layer or the $Ag_4$Sn layer has a thickness between 1 nm and 3 nm.

In one embodiment, the transparent conductive thin film filters out the infrared or the ultraviolet.

In one embodiment, the transparent conductive thin film is applied to a touch panel, a display panel, a light-emitting apparatus, or a photovoltaic cell.

In one embodiment, the transparent conductive thin film further comprises a structure layer that is disposed adjacent to the Ag layer or the SnOx layer. The structure layer is a single layer or a multi-layer.

In one embodiment, the structure layer includes metal, metal oxide, optical material, ceramics, or their combination.

In one embodiment, at least one stack layer is stacked with the structure layer.

In one embodiment, in the case of a plurality of structure layers, at least one stack layer is disposed between the structure layers.

As mentioned above, by the continuous effort and research, $Ag_3$Sn and/or $Ag_4$Sn is developed to produce the transparent conductive thin film, thereby increasing the electric conductivity of the transparent conductive thin film and also lowering down the resistance. The transparent conductive thin film of the invention includes at least one stack layer of Ag—$Ag_3$Sn—SnOx or at least one stack layer of Ag—$Ag_4$Sn—SnOx so that the resistance can be lowered down to 1 Ω/sq for improving the signal's transmission and response speed. Besides, the transparent conductive thin film containing $Ag_3$Sn or $Ag_4$Sn can filter out the infrared (IR-Cut) and the ultraviolet (UV-Cut). Hence, the photo-yellowing will not be caused to the semiconductor photoelectric apparatus configured with the transparent conductive thin film of the invention.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1A:
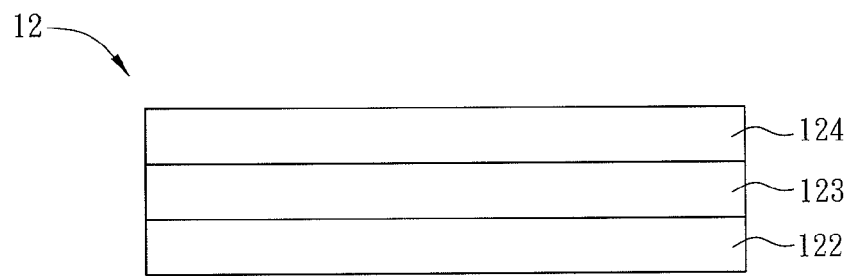
FIGS. 1A to 1E are schematic diagrams of different transparent conductive thin films of a preferred embodiment of the invention.

FIG. 1A is a schematic diagram of a transparent conductive thin film 12 of a preferred embodiment of the invention. The transparent conductive thin film 12 includes $Ag_3$Sn or Ag4Sn. The transparent conductive thin film 12 can include at least one stack layer of Ag—$Ag_3$Sn—SnOx or at least one stack layer of Ag—$Ag_4$Sn—SnOx. Herein, the transparent conductive thin film 12 is instanced as having a stack layer containing an Ag layer 122, an $Ag_3$Sn layer 123, and an SnOx layer 124. Of course, some $Ag_4$Sn may exist in the $Ag_3$Sn layer 123. The Ag layer 123 has a thickness between 2 nm and 15 nm for example. The $Ag_3$Sn layer 123 or the $Ag_4$Sn layer has a thickness between 1 nm and 3 nm for example. The SnOx layer 124 contains $SnO_2$, SnO or their combination for example.

Figure 1B:
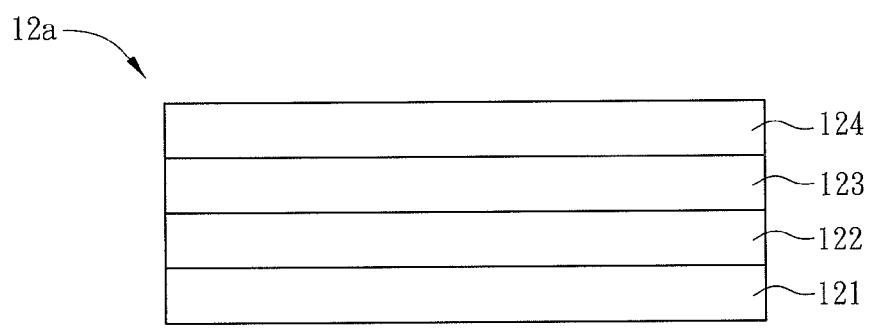

FIG. 1B is a schematic diagram of another transparent conductive thin film 12a of the preferred embodiment of the invention. The transparent conductive thin film 12a further includes a structure layer 121 that is disposed adjacent to the Ag layer 122. The structure layer 121 can be a single layer or a multi-layer. The structure layer 121 includes, for example, metal, metal oxide, optical material, ceramics, or their combination. The metal is such as silver or copper. The metal oxide is such as ZnO, SnO, $SnO_2$, ITO, GZO, or ATO. The optical material is such as $TiO_2$. The ceramics is such as $SiO_2$. The above materials are just for example, and not for limiting the scope of the invention.

Figure 1C:
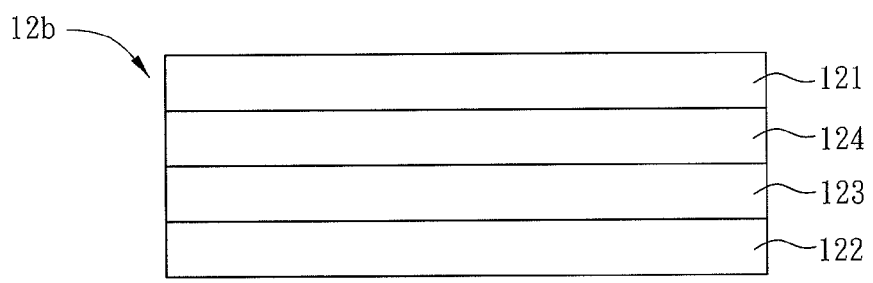

FIG. 1C is a schematic diagram of another transparent conductive thin film 12b of the preferred embodiment of the invention. Herein, the transparent conductive thin film 12b has a structure layer 121 that is disposed adjacent to the SnOx layer 124.

Figure 1D:
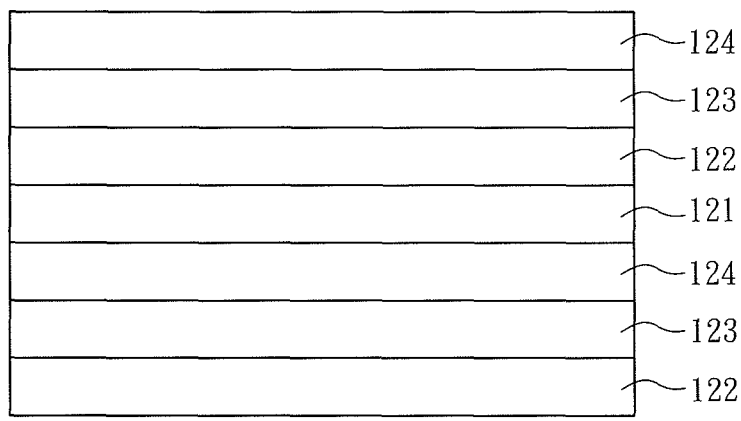

FIG. 1D is a schematic diagram of another transparent conductive thin film 12c of the preferred embodiment of the invention. Herein, the transparent conductive thin film 12c includes two stack layers, each of which includes an Ag layer 122, an $Ag_3Sn$ layer 123, and an SnOx layer 124. The structure layer 121 is disposed between the two stack layers.

Figure 1E:
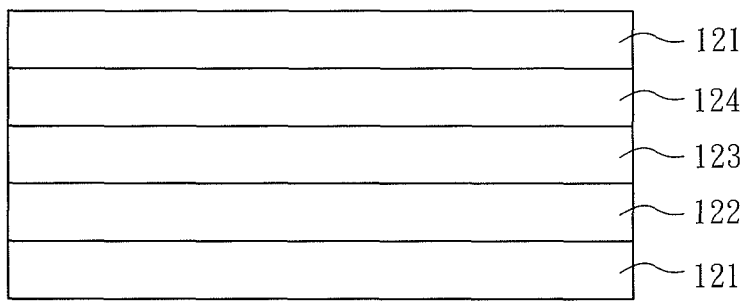

FIG. 1E is a schematic diagram of another transparent conductive thin film 12d of the preferred embodiment of the invention. Herein, the transparent conductive thin film 12d includes a stack layer containing an Ag layer 122, an $Ag_3Sn$ layer 123, and an SnOx layer 124, and two structure layers 121. The stack layer is disposed between the two structure layers 121. The structure layers 121 can be the same or different from each other.

To be noted, the cases of the transparent conductive thin film as shown in FIGS. 1A to 1E are just for example, and the transparent conductive thin film can be varied otherwise. For example, the transparent conductive thin film can have more stack layers or the structure layer 121 at different locations.

Figure 2:
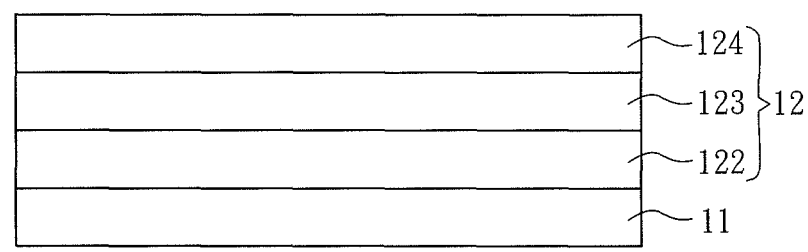
FIG. 2 is a schematic diagram of a transparent conductive thin film disposed on a substrate of the preferred embodiment of the invention.

FIG. 2 is a schematic diagram of a transparent conductive thin film 12 disposed on a substrate 11. To be noted, the transparent conductive thin film 12 can be replaced by anyone of the transparent conductive thin films 12a to 12d. The material of the substrate 11 includes glass, ceramic, metal, or plastic for example. The plastic is such as polyethylene terephthalate (PET). The substrate 11 can be permeable or opaque for the light.

Figure 3A:
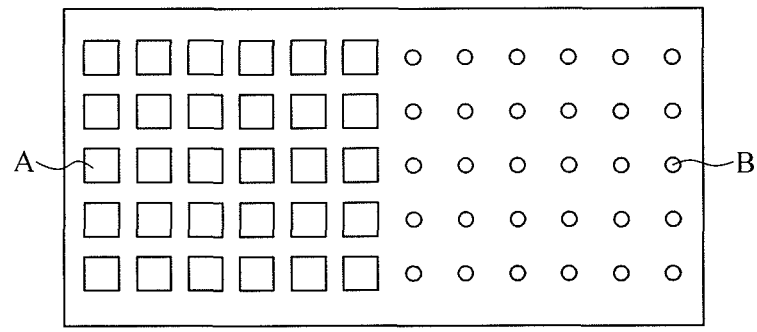
FIGS. 3A and 3B are schematic diagrams showing the formation of the intermetal.
Figure 3B:
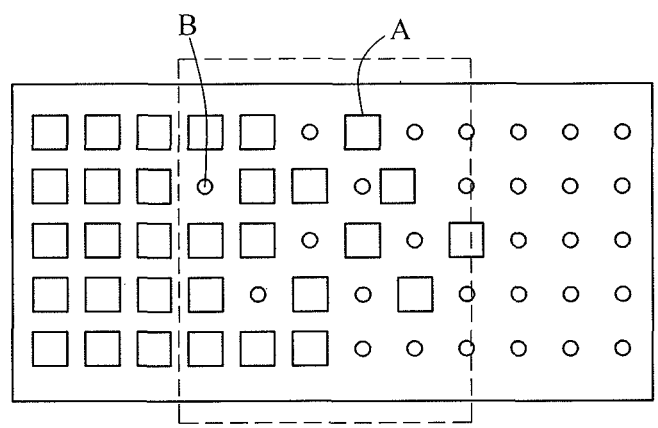

Through a thermal process, the intermetal (such as $Ag_3Sn$ and $Ag_4Sn$) is formed in the transparent conductive thin film 12. During the process, the Ag layer, the Sn layer, and the SnOx layer, constituting the stack layer, are sequentially formed on the substrate 11, and then they are subjected to a thermal process to form the intermetal. FIGS. 3A and 3B are schematic diagrams showing the intermetal formed by the thermal diffusion, in which the numeral A represents Ag while B represents Sn. To be noted, in FIG. 3A, the Ag layer and the Sn layer arranged side by side are just for the clear illustration to describe the formation of the intermetal, but not for limiting the scope of the invention. As shown in FIGS. 3A and 3B, during the thermal process, the Ag A and Sn B will be driven by the thermal diffusion so as to form the intermetal (Ag3Sn and/or Ag4Sn) located at the joint of the Ag A and Sn B.

In the process, if the Ag is oxidized, the electric property of the transparent conductive thin film 12 will be affected. However, in this embodiment, the Sn is easily bonded with the Ag due to the high thermal effect to become the intermetal, $Ag_3Sn$ and/or $Ag_4Sn$, which is very stable so as to prevent the Ag from being oxidized. As a result, the stack layer of Ag—$Ag_3Sn$—SnO or Ag—$Ag_4Sn$—SnO is formed.

Accordingly, the resistance of the transparent conductive thin film 12 can be lowered down to 1 Ω/sq, thereby improving the signal transmission and the response speed. Furthermore, the transparent conductive thin film of the embodiment can filter out the infrared (IR-Cut) or the ultraviolet (UV-Cut).

Besides, the transparent conductive thin film 12 can be a planar layer or a patterned layer according to the practical requirements. For example, as the transparent conductive thin film 12 is a common electrode layer of a liquid crystal display (LCD) panel, it can be a planar layer; as the transparent conductive thin film 12 is a touch electrode layer of a touch panel, it can be a patterned layer.

In the embodiment, the transparent conductive thin films 12 to 12d are not limited in their applications. They can be applied to a semiconductor photoelectric apparatus, such as a display panel, a touch panel, a photovoltaic cell, or a light-emitting apparatus. The following illustration is given by taking the photovoltaic cell as an example, and especially the photovoltaic cell is the dye sensitized solar cell (DSSC).

Figure 4:
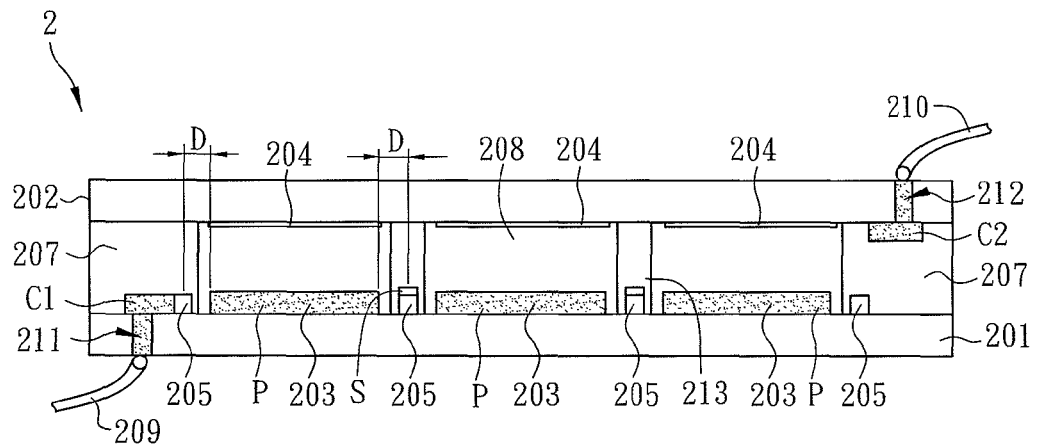
FIGS. 4 and 5 are schematic diagrams of dye sensitized solar cells configured with the transparent conductive thin film of the preferred embodiment of the invention.

FIG. 4 is a schematic diagram of a dye sensitized solar cell 2 of a preferred embodiment of the invention. The dye sensitized solar cell 2 includes a first conductive substrate 201, a dye layer 203, a first conductive layer 205, and a second conductive substrate 202.

The first conductive substrate 201 and/or the second conductive substrate 202 can have anyone of the transparent conductive thin films 12 to 12d. The transparent conductive thin films 12 to 12d are illustrated clearly as the above embodiments, so the detailed descriptions thereof are omitted here. In the embodiment, the sun's light passes through the first conductive substrate 201 so that the first conductive substrate 201 is light-permeable, and the second substrate 202 can be light-permeable or opaque.

The dye layer 203 is disposed on the first conductive substrate 201, and is a part of the photoelectric material of the embodiment. The dye layer 203 has a plurality of dye portions P. For forming the dye layer 203, a dye-absorbing layer (such as titanium dioxide ($TiO_2$)) can be disposed on the first conductive substrate 201, and then the dye is disposed so that the $TiO_2$ can absorb the dye to become the dye layer 203. The dye layer 203 will generate electrons by receiving the light, and the electrons will be transmitted to the transparent conductive thin films (not shown) of the conductive substrates 201 and 202. Herein, the dye in the dye layer 203 can include, for example, ruthenium metal complexes pigment, or organic pigment, such as methoxy pigment or phthalocyanine.

The first conductive layer 205 is disposed on the first conductive substrate 201 and around the dye portions P. The first conductive layer 205 is a silver paste for example. It also can be another kind of conductive paste, such as an aluminum paste or a copper paste. The first conductive layer 205 can be formed by printing, coating, or paste dispensing. The first conductive layer 205 can assist the transmission of the electrons generated by the dye portions P. In detail, the electrons generated by the dye portions P will be transmitted to the transparent conductive thin film of the first conductive substrate 201, and then be transmitted to the first conductive layer 205 through the transparent conductive thin film.

The first conductive layer 205 is disposed around the dye layer 203. A distance D between the first conductive layer 205 and the dye layer 203 is between 0.5 mm and 50 mm, and preferably between 1 mm and 10 mm. According to such features, the power generating efficiency of the embodiment can be improved more effectively. Of course, the distance D can be changed according to the practical requirements.

The dye sensitized solar cell 2 can further include an insulating protective layer S, which is disposed on the first conductive layer 205. The material of the insulating protective layer S can include, for example, glass paste, such as bismuth oxide, for reducing the oxidation of the partial first conductive layer 205 and also providing the electrical insulation.

Besides, an electricity-collecting portion C1 (shaped like a strip for example) is disposed at an outermost side of the first conductive layer 205 for collecting the current of the dye sensitized solar cell 2, and can function as an anode or a cathode to electrically connect with the neighboring dye sensitized solar cell or an external control circuit in parallel or in series.

The first conductive substrate 201 can further have a first conductive hole 211 therein, and a first conductive wire 209 is electrically connected with the first conductive substrate 201 through the first conductive hole 211. The first conductive wire 209 can be a printed wire or a cable, and is instanced as a cable here. The first conductive hole 211 is filled with a conductive solder, and welded so as to electrically connect the first conductive wire 209. Besides, the first conductive hole 211 is electrically connected with the first conductive substrate 201 through the first conductive layer 205. Herein, a portion (electricity-collecting portion C1) of the first conductive layer 205 is directly connected with the first conductive hole 211. Besides, in the case of the two dye sensitized solar cells 2 connected with each other, wires can be used to connect the electricity-collecting portions C1 to achieve the cells' connection.

The second conductive substrate 202 is disposed opposite to the first conductive substrate 201. A catalytic layer 204 is disposed on the second conductive substrate 202. The catalytic layer 204 is made by platinum (Pt) or carbon for example, improving the oxidation reduction of an electrolyte 208.

Figure 5:
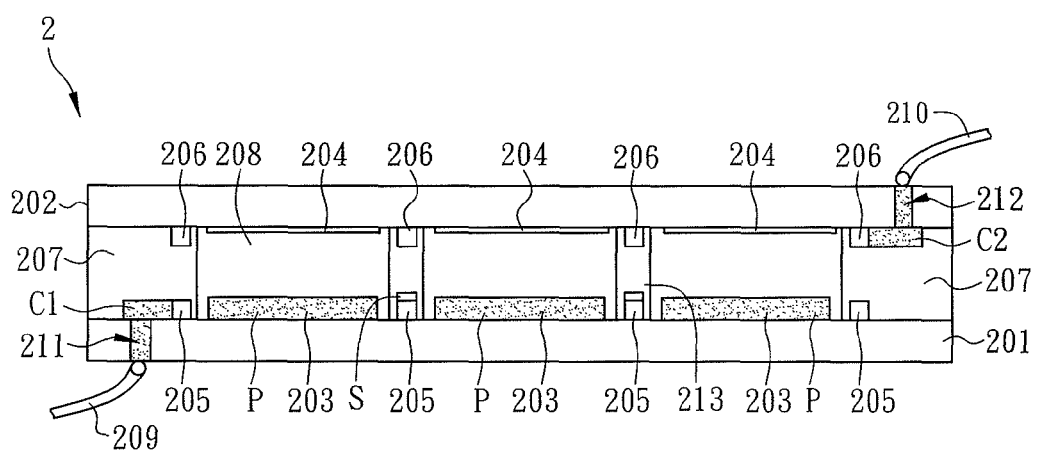

Referring to FIG. 5, the dye sensitized solar cell 2 can further include a second conductive layer 206, which is disposed on the second conductive substrate 202. A second conductive hole 212 is electrically connected with the second conductive substrate 202 through the second conductive layer 206. A portion (an electricity-collecting portion C2) of the second conductive layer 206 is directly connected with the second conductive hole 212, and the other portion of the second conductive layer 206 is disposed around the catalytic layer 204 to be formed into at least one frame portion. In the embodiment, the line width of the first conductive layer 205 or the second conductive layer 206 is between 0.1 mm and 30 mm for example, and preferably between 0.3 mm and 15 mm. To be noted, the line widths of the first and second conductive layers 205 and 206 can be equivalent or different.

The second conductive layer 206 can improve the transmission of the electrons. The second conductive layer 206 and the first conductive layer 205 constitute an electrical loop. An electricity-collecting portion C2 (shaped like a strip for example, and substantially parallel with the electricity-collecting portion C1 of the first conductive layer 205) is disposed at an outermost side of the second conductive layer 206 for collecting the current of the dye sensitized solar cell 2, and can function as an anode or a cathode of the dye sensitized solar cell 2 to electrically connect a neighboring dye sensitized solar cell or an external control circuit in parallel or in series. The second conductive layer 206 is a silver paste for example; otherwise, it can be an aluminum paste, a copper paste or the like. The dye sensitized solar cell 2 can further include an insulating protective layer, which is disposed on the frame portion of the second conductive layer 206. The material of the insulating protective layer can include, for example, glass paste, such as a bismuth oxide, for reducing the oxidation of the frame portion of the second conductive layer 206 and also preventing a short circuit between the second conductive layer 206 and the first conductive layer 205.

Besides, the dye sensitized solar cell 2 can further include a second conductive wire 210, which is electrically connected with the second conductive substrate 202 through the second conductive hole 212. The second conductive wire 210 can be a printed wire or a cable, and is instanced as a cable here. The second conductive hole 212 is filled with a conductive solder, and welded to electrically connect the second conductive wire 210. Besides, the second conductive hole 212 is electrically connected with the second conductive substrate 202 through the second conductive layer 206. Herein, a portion (electricity-collecting portion C2 for example) of the second conductive layer 206 is directly connected with the second conductive hole 212.

The dye sensitized solar cell 2 can further include a sealant 207, which connects the first conductive substrate 201 and the second conductive substrate 202. The first and second conductive substrates 201 and 202 and the sealant 207 constitute a sealed space therein. The sealant 207 can include a resin material that is waterproof and heat-resistant for extending the lifetime of the product.

In order to increase the connection strength between the first and second conductive substrates 201 and 202, an adhesive 213 can be disposed between them. Herein, the adhesive 213 is disposed between the first conductive layer 205 and the second conductive layer 206 to connect the first and second conductive substrates 201 and 202. The adhesive 213 can be an insulating adhesive. Besides, the sealant 207 and the adhesive 213 can be made by the same material, such as a hot-melt adhesive, a UV adhesive, or an epoxy resin.

The dye sensitized solar cell 2 can further include an electrolyte 208, which is filled in the sealed space. The electrolyte 208 can be a part of the photoelectric material of the embodiment. After being illuminated, the dye molecules in the dye layer 203 are excited to the excited state, rapidly providing electrons to the first conductive substrate 201 or the first conductive layer 205, and then become the oxidation state after providing the electrons. Subsequently, after obtaining the electrons from the electrolyte 208, the dye molecules on the oxidation state come back to the ground state so that the dye molecules are recovered. As to the electrolyte 208 having provided the electrons, it will diffuse to the second conductive substrate 202 or the second conductive layer 206 to get recovered by obtaining the electrons. Accordingly, a photoelectric chemical reaction cycle is completed.

Besides, the transparent conductive thin films 12 to 12d can be applied to another kind of photovoltaic cell, such as silicon-based photovoltaic cell, compound semiconductor photovoltaic cell, or organic photovoltaic cell. With the different kinds of photovoltaic cells, the photoelectric materials thereof are different, such as silicon-based material, compound semiconductor material, or organic material.

Figure 6:
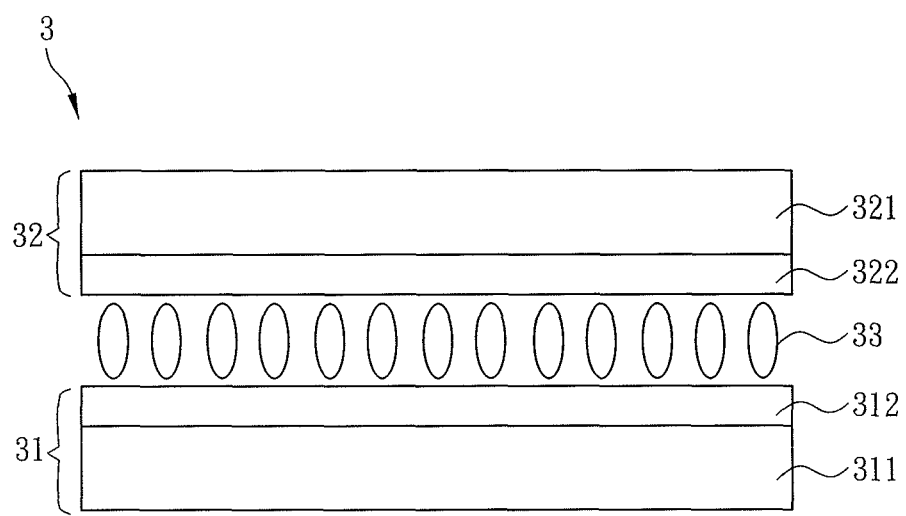
FIG. 6 is a schematic diagram of a display panel configured with the transparent conductive thin films of the preferred embodiment of the invention.

FIG. 6 is a schematic diagram of a display panel to which anyone of the transparent conductive thin films 12 to 12d is applied. The display panel is instanced as an LCD panel. As shown in FIG. 6, an LCD panel 3 includes a thin film transistor (TFT) substrate 31, a color filter (CF) substrate 32, and a liquid crystal layer 33. The liquid crystal layer 33 is disposed between the substrates 31 and 32. The TFT substrate 31 includes a substrate 311 and a TFT array 312, which is disposed on the substrate 311 and includes a plurality of pixel electrodes (not shown) corresponding to the respective pixels. The CF substrate 32 includes a substrate 321 and a common electrode 322. By the voltage difference between each of the pixel electrodes and the common electrode 322, the liquid crystal of each of the pixels can be rotated to form the image. The transparent conductive thin films 12 to 12d can be applied to the common electrode 322 and/or the pixel electrode to lower down the resistance and heighten the light transmittance.

In summary, by the continuous effort and research, $Ag_3Sn$ and/or $Ag_4Sn$ is developed to produce the transparent conductive thin film, thereby increasing the electric conductivity of the transparent conductive thin film and also lowering down the resistance. The transparent conductive thin film of the invention includes at least stack layer of Ag—$Ag_3Sn$—$SnOx$ or at least one stack layer of Ag—$Ag_4Sn$—$SnOx$ so that the resistance can be lowered down to 1 Ω/sq for improving the signal's transmission and response speed. Besides, the transparent conductive thin film containing $Ag_3Sn$ or $Ag_4Sn$ can filter out the infrared (IR-Cut) and the ultraviolet (UV-Cut). Hence, the photo-yellowing will not be caused to the semiconductor photoelectric apparatus configured with the transparent conductive thin film of the invention.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A transparent conductive thin film, comprising:
   at least one stack layer of Ag—$Ag_3Sn$—SnOx or at least one stack layer of Ag—$Ag_4Sn$—SnOx.

2. The transparent conductive thin film as recited in claim 1, wherein the Ag layer has a thickness between 2 nm and 15 nm.

3. The transparent conductive thin film as recited in claim 1, wherein the Ag3Sn layer or the Ag4Sn layer has a thickness between 1 nm and 3 nm.

4. The transparent conductive thin film as recited in claim 1, filtering out the infrared or the ultraviolet.

5. The transparent conductive thin film as recited in claim 1, applied to a touch panel, a display panel, a light-emitting apparatus, or a photovoltaic cell.

6. The transparent conductive thin film as recited in claim 1, further comprising:
   a structure layer disposed adjacent to the Ag layer or the SnOx layer.

7. The transparent conductive thin film as recited in claim 6, wherein the structure layer is a single layer or a multi-layer.

8. The transparent conductive thin film as recited in claim 6, wherein the structure layer includes metal, metal oxide, optical material, ceramics, or their combination.

9. The transparent conductive thin film as recited in claim 6, wherein at least one stack layer is stacked with the structure layer.

10. The transparent conductive thin film as recited in claim 6, wherein in the case of a plurality of structure layers, at least one stack layer is disposed between the structure layers.

* * * * *